United States Patent
Sugawara et al.

(10) Patent No.: US 11,658,238 B2
(45) Date of Patent: May 23, 2023

(54) SEMICONDUCTOR DEVICE

(71) Applicant: Mitsubishi Electric Corporation, Tokyo (JP)

(72) Inventors: Katsutoshi Sugawara, Tokyo (JP); Yasuhiro Kagawa, Tokyo (JP); Yutaka Fukui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 202 days.

(21) Appl. No.: 16/912,439

(22) Filed: Jun. 25, 2020

(65) Prior Publication Data
US 2021/0091220 A1    Mar. 25, 2021

(30) Foreign Application Priority Data
Sep. 19, 2019    (JP) .............................. JP2019-170127

(51) Int. Cl.
*H01L 29/78*    (2006.01)
*H03K 17/687*    (2006.01)
(Continued)

(52) U.S. Cl.
CPC .... *H01L 29/7815* (2013.01); *H01L 29/66068* (2013.01); *H01L 29/7811* (2013.01);
(Continued)

(58) Field of Classification Search
CPC ............. H01L 29/7815; H01L 29/7813; H01L 29/66068; H01L 29/0623; H01L 29/0657;
(Continued)

(56) References Cited

U.S. PATENT DOCUMENTS

2016/0087094 A1    3/2016 Takaya et al.
2016/0190307 A1    6/2016 Kagawa et al.
(Continued)

FOREIGN PATENT DOCUMENTS

JP    2011086746 A    4/2011
JP    2016063107 A    4/2016
(Continued)

OTHER PUBLICATIONS

An Office Action; "Notice of Reasons for Refusal," Japanese Patent Office dated Oct. 4, 2022, which corresponds to Japanese Patent Application No. 2019-170127 and is related to U.S. Appl. No. 16/912,439; with English language translation.

*Primary Examiner* — Ermias T Woldegeorgis
(74) *Attorney, Agent, or Firm* — Studebaker & Bracket PC

(57) ABSTRACT

A semiconductor device includes a trench-type switching element formed in an active region and a trench-type current sense element formed in a current sense region. Below a trench in which a gate electrode of the switching element is embedded, a trench in which a gate electrode of the current sense element is embedded, and a trench formed at the boundary portion between the active region and the current sense region, protective layers are formed, respectively. The protective layer at the boundary portion between the active region and the current sense region has a divided portion that is divided in a direction from the active region to the current sense region.

15 Claims, 17 Drawing Sheets

(51) Int. Cl.
*H01L 29/66* (2006.01)
*H01L 29/16* (2006.01)
*H01L 29/06* (2006.01)
*H01L 29/423* (2006.01)

(52) U.S. Cl.
CPC ....... *H01L 29/7813* (2013.01); *H03K 17/687* (2013.01); *H01L 29/0623* (2013.01); *H01L 29/0696* (2013.01); *H01L 29/1608* (2013.01); *H01L 29/4238* (2013.01)

(58) Field of Classification Search
CPC ............. H01L 29/0696; H01L 29/1608; H01L 29/4238; H01L 29/7811; H01L 27/088; H01L 22/34; H01L 29/7827; H03K 17/687
See application file for complete search history.

(56) References Cited

U.S. PATENT DOCUMENTS

| | | | |
|---|---|---|---|
| 2019/0189756 A1* | 6/2019 | Okumura | H01L 29/4236 |
| 2019/0341484 A1 | 11/2019 | Takeuchi et al. | |
| 2020/0020797 A1 | 1/2020 | Suzuki et al. | |

FOREIGN PATENT DOCUMENTS

| | | | | |
|---|---|---|---|---|
| JP | 6099749 B2 | | 3/2017 | |
| JP | 2018121020 A | * | 8/2018 | ......... H01L 21/0465 |
| JP | 2018121020 A | | 8/2018 | |
| JP | 2019-106507 A | | 6/2019 | |
| WO | 2015/015808 A1 | | 2/2015 | |
| WO | 2019069580 A1 | | 4/2019 | |

* cited by examiner

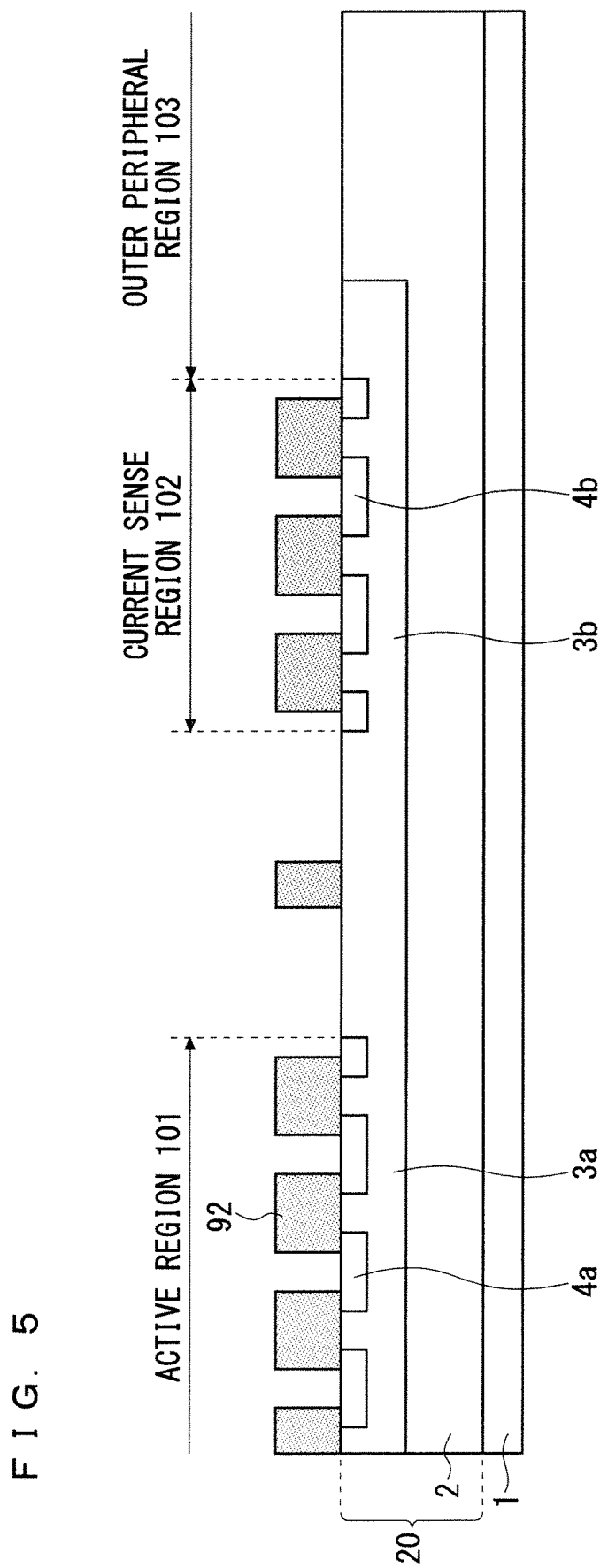
F I G. 5

F I G. 7
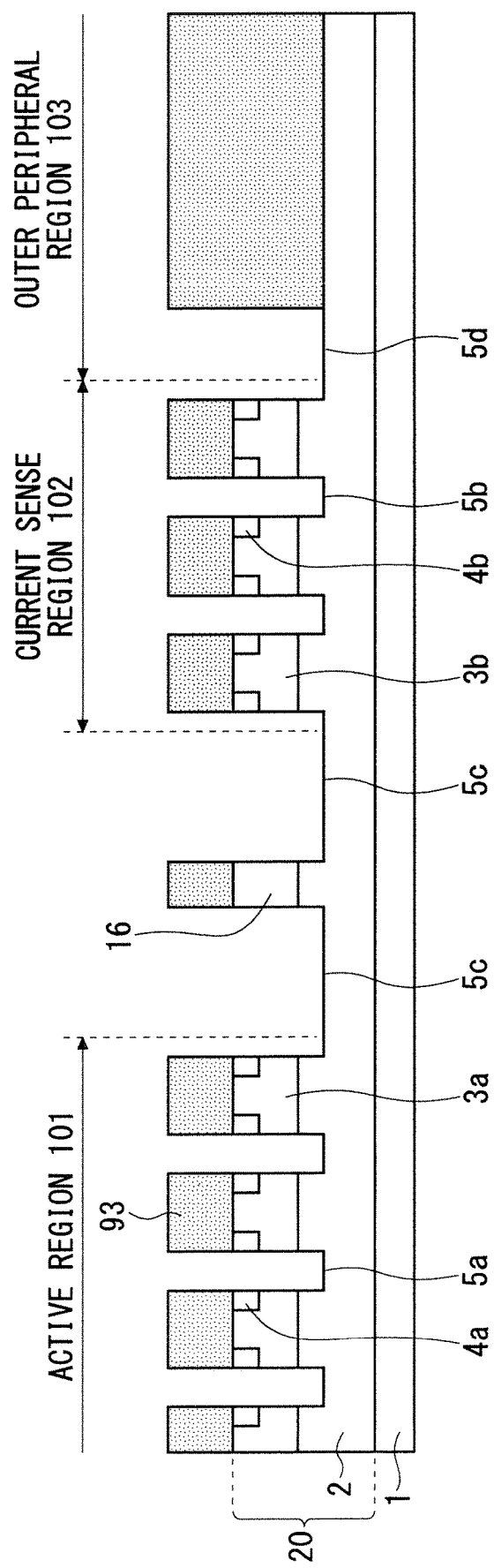

SEMICONDUCTOR DEVICE

BACKGROUND OF THE INVENTION

Field of the Invention

The present invention relates to a semiconductor device, and more particularly to a semiconductor device including a trench-type switching element and a trench-type current sense element.

Description of the Background Art

In power electronics devices, insulated gate semiconductor devices such as IGBTs (Insulated Gate Bipolar Transistors) and MOSFETs (Metal Oxide Semiconductor Field Effect Transistors) are widely used as switching elements for controlling power supply to loads such as motors. As one of vertical MOSFETs for power control, there is a trench MOSFET having a structure in which a gate electrode is embedded in a semiconductor layer.

The power control MOSFET operates to repeat an ON state in which a large current and a low voltage occur and an OFF state in which a small current and a high voltage occur. Conduction loss, which is a loss when the MOSFET is in the ON state, is determined by the drain-source current and the ON-resistance of the MOSFET. Since a trench MOSFET can have a higher channel width density than a planar MOSFET, the ON-resistance per unit area can be reduced. Further, when the trench MOSFET is formed by using a hexagonal system material such as SiC, it is expected that a considerable reduction in ON-resistance is obtained because the current path matches an a-axis direction having a high carrier mobility.

However, the trench MOSFET has a problem that an electric field tends to concentrate on the bottom of the trench, and the electric field concentration tends to cause breakage of a gate oxide film. Therefore, it is important for the trench MOSFET to suppress the electric field concentration on the bottom of the trench. For example, Japanese Patent No. 6099749 discloses a technique in which a protective layer having a conductivity type opposite to that of a drift layer is provided at the bottom of a trench of a MOSFET. By providing the protective layer at the bottom of the trench, the depletion layer can be expanded from the protective layer to the drift layer, and the electric field applied to the bottom of the trench can be reduced.

A general power control MOSFET includes a plurality of MOSFET cells, which are unit elements of a MOSFET, arranged in parallel connection, an active region that conducts current in the ON state, and an outer peripheral region that is provided to surround the active region and in which a guard ring, a metal wire, and the like are arranged. The electric field distribution becomes singular at the boundary portion between the active region and the outer peripheral region, and depending on the shape of the outer peripheral region, the singular electric field distribution causes a reduction in the voltage withstand capability of the MOSFET. Japanese Patent No. 6099749 also discloses a technique in which a trench and a protective layer are also provided in an outer peripheral region as in an active region, thereby flattening the electric field distribution of the entire MOSFET and improving the voltage withstand capability of the MOSFET.

Further, when a load driven by the MOSFET is in a short-circuited state for some reason, the MOSFET can be instantaneously in a state of a large current and a high voltage. In this state, there is a possibility that the MOSFET is broken by heat generated by a large power. As a method for preventing the breakage of the MOSFET, there is a method for monitoring a current flowing through the MOSFET and turning off the MOSFET when an overcurrent occurs. As a technique for monitoring a current flowing through a MOSFET, a technique for mounting an element called a current sense on the MOSFET is widely known.

The current sense element is obtained by electrically separating some MOSFET cells from the active region, and contributes to detection of overcurrent by flowing a part of the current flowing through the MOSFET to an overcurrent detection circuit. Hereinafter, a MOSFET cell used as the current sense element is referred to as a "current sense cell", and a region where the current sense cell is arranged is referred to as a "current sense region". Unless otherwise specified, the "MOSFET cell" refers to a MOSFET cell in the active region, not a current sense cell.

Usually, the current sense region is provided in a region surrounded by the outer peripheral region together with the active region. In addition, the current sense cell and the MOSFET cell share a drain electrode, but a source electrode of the current sense cell is insulated from a source electrode of the MOSFET cell. The reason is that when the source electrode of the current sense cell and the source electrode of the MOSFET cell are electrically connected, part of the current flowing through the active region flows into the current sense region and becomes noise, and the overcurrent cannot be detected correctly.

When a current sense element is mounted on a semiconductor device, at the boundary portion between the current sense region where the current sense cells are arranged and the active region where the MOSFET cells are arranged, the electric field distribution tends to be singular as at the boundary portion between the active region and the outer peripheral region, and such singular electric field distribution can be a cause of a reduction in voltage withstand capability of the MOSFET.

SUMMARY

An object of the present invention is to improve the voltage withstand capability of a semiconductor device including a trench-type switching element and a trench-type current sense element.

A semiconductor device according to the present invention includes a semiconductor layer in which a first conductivity-type drift layer is formed, a trench-type switching element in which a gate electrode is embedded in a first trench formed in the semiconductor layer to reach the drift layer, and a trench-type current sense element in which a gate electrode is embedded in a second trench formed in the semiconductor layer to reach the drift layer. A third trench reaching the drift layer is formed in the semiconductor layer at the boundary portion between the active region where the switching element is formed and the current sense region where the current sense element is formed. A second conductivity-type first protective layer is formed below the first trench in the drift layer. A second conductivity-type second protective layer is formed below the second trench in the drift layer. A second conductivity-type third protective layer is formed below the third trench in the drift layer. The third protective layer has a divided portion divided in a first direction from the active region to the current sense region.

With the semiconductor device according to the present invention, the first protective layer is provided below the first trench and the second protective layer is provided below the second trench, and thus concentration of the electric field on the bottom of the first and second trenches can be suppressed. In addition, the third trench and the third protective layer are provided at the boundary portion between the active region and the current sense region, and thus the electric field distribution at the boundary portion between the active region and the current sense region is suppressed from becoming singular. Further, since the third protective layer has the divided portion, short circuit between the active region and the current sense region through the third protective layer is prevented. Therefore, electric field concentration due to the provision of the current sense region is suppressed, and it is possible to contribute to improvement of the voltage withstand capability of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 12 are views each for explaining a method of forming a protective layer in manufacture of the semiconductor device according to the second preferred embodiment;

DESCRIPTION OF THE PREFERRED EMBODIMENTS

Hereinafter, preferred embodiments of the present invention will be described. In the following description, the first conductivity type is N-type, and the second conductivity type is P-type. Conversely, the first conductivity type may be P-type and the second conductivity type may be N-type. Further, in each preferred embodiment, the switching element included in the semiconductor device is a MOSFET, but it is sufficient if the switching element is a trench-type element, and the switching element may be, for example, an IGBT or the like.

First Preferred Embodiment

Figure 1:
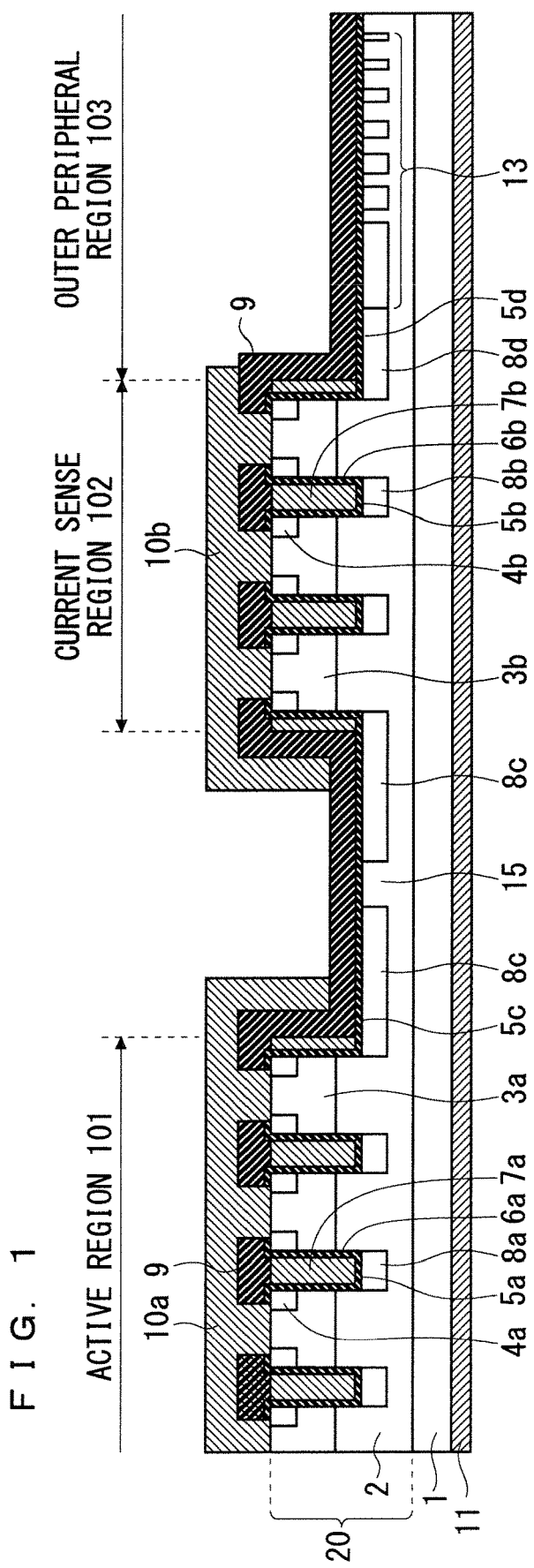
FIG. 1 is a cross-sectional view illustrating a configuration of a semiconductor device according to a first preferred embodiment.

FIG. 1 is a cross-sectional view illustrating a configuration of a semiconductor device according to the first preferred embodiment. As illustrated in FIG. 1, the semiconductor device according to the first preferred embodiment is formed using a first conductivity-type semiconductor substrate 1. In the present preferred embodiment, a silicon carbide (SiC) semiconductor substrate is used as the semiconductor substrate 1. Switching elements such as MOSFETs and IGBTs formed using wide band gap semiconductors such as silicon carbide (SiC) are attracting attention as next-generation switching elements, and it is expected that the switching elements are applied to technical fields that handle a high voltage of about 1 kV or more. Wide band gap semiconductors include, for example, gallium nitride (GaN)-based materials and diamond in addition to SiC.

On the semiconductor substrate 1, a semiconductor layer 20, which is an epitaxial growth layer of silicon carbide, is formed. As illustrated in FIG. 1, an active region 101 in which a MOSFET cell is formed, a current sense region 102 in which a cell of a current sense element is formed, and an outer peripheral region 103 provided around the active region 101 and the current sense region 102 are defined in the semiconductor substrate 1 and the semiconductor layer 20. In the cross-sectional view of FIG. 1, the active region 101, the current sense region 102, and the outer peripheral region 103 are illustrated in this order from the left, but the order in which the regions are arranged is not limited to this. The same region may appear twice or more, such as the active region 101, the current sense region 102, the active region 101, and the outer peripheral region 103, depending on the layout of each region and the position viewed in cross-section.

In the semiconductor layer 20, a drift layer 2, which is a first conductivity-type region, is formed across the active region 101, the current sense region 102, and the outer peripheral region 103. The impurity concentration of the first conductivity type of the drift layer 2 is set lower than that of the semiconductor substrate 1.

A second conductivity-type base region 3a that functions as a base region of the MOSFET is formed in a surface part of the drift layer 2 in the active region 101. A second conductivity-type base region 3b that functions as a base region of the current sense element is formed in a surface part of the drift layer 2 in the current sense region 102. In the present preferred embodiment, the base regions 3a and 3b are simultaneously formed in the same ion implantation process. Therefore, the base regions 3a and 3b have the same depth and impurity concentration.

A first conductivity-type source region 4a that functions as a source region of the MOSFET is formed in a surface part of the base region 3a in the active region 101. A first conductivity-type source region 4b that functions as a source region of the current sense element is formed in a surface part of the base region 3b in the current sense region 102. In the present preferred embodiment, the source regions 4a and 4b are simultaneously formed in the same ion implantation process. Therefore, the source regions 4a and 4b have the same depth and impurity concentration.

In the semiconductor layer 20 of the active region 101, a trench 5a, which is a first trench, is formed to reach the drift layer 2 below the base region 3a, and a gate insulating film 6a and a gate electrode 7a of the MOSFET are embedded in the trench 5a. The gate insulating film 6a is formed on an inner surface (side surface and bottom surface) of the trench 5a, and the gate electrode 7a is disposed to face the source region 4a and the base region 3a via the gate insulating film 6a.

Similarly, in the semiconductor layer 20 of the current sense region 102, a trench 5b, which is a second trench, is formed to reach the drift layer 2 below the base region 3b, and a gate insulating film 6b and a gate electrode 7b of the current sense element are embedded in the trench 5b. The gate insulating film 6b is formed on an inner surface of the trench 5b, and the gate electrode 7b is disposed to face the source region 4b and the base region 3b via the gate insulating film 6b.

In the semiconductor layer 20 at the boundary portion between the active region 101 and the current sense region 102, a trench 5c, which is a third trench, is formed to have a wider width than the trenches 5a and 5b to reach the drift layer 2. The trench 5c plays a role of insulating the active region 101 from the current sense region 102. Further, in the semiconductor layer 20 of the outer peripheral region 103, a trench 5d, which is a fourth trench, is formed to reach the drift layer 2.

In the drift layer 2, below the trenches 5a to 5d, second conductivity-type protective layers 8a to 8d are formed, respectively. That is, the protective layer 8a, which is a first protective layer, is formed below the trench 5a in which the gate electrode 7a of the MOSFET is embedded. The protective layer 8b, which is a second protective layer, is formed below the trench 5b in which the gate electrode 7b of the current sense element is embedded. In addition, the protective layer 8c, which is a third protective layer, is formed below the trench 5c at the boundary portion between the active region 101 and the current sense region 102. Further, below the trench 5d of the outer peripheral region 103, the protective layer 8d, which is a fourth protective layer, is formed in an inner peripheral portion of the outer peripheral region 103 (that is, a portion adjacent to the active region 101 or the current sense region 102), and a second conductivity-type guard ring 13 is formed on an outer side of the protective layer 8d in the outer peripheral region 103. It is desirable that the impurity concentration of the protective layers 8a to 8d be higher than the impurity concentration of the guard ring 13.

Here, the protective layer 8c formed below the trench 5c at the boundary portion between the active region 101 and the current sense region 102 includes a divided portion 15 divided in the first direction from the active region 101 to the current sense region 102. As described above, the trench 5c plays a role of insulating the active region 101 from the current sense region 102, and the protective layer 8c includes the divided portion 15 such that short-circuit between the active region 101 and the current sense region 102 through the protective layer 8c is prevented.

In the present preferred embodiment, the trenches 5a to 5d are simultaneously formed in the same etching process, and the depths of the trenches 5a to 5d are all the same. Further, the gate insulating films 6a and 6b are simultaneously formed in the same insulating film forming process, and the materials and the thicknesses of the gate insulating films 6a and 6b are the same. Further, the gate electrodes 7a and 7b are simultaneously formed in the same electrode forming process, and the materials of the gate electrodes 7a and 7b are the same. Further, the protective layers 8a to 8d are also simultaneously formed in the same ion implantation process, and the protective layers 8a to 8d have the same depth and impurity concentration. Note that the details of the process of forming the protective layers 8a to 8d will be described below.

On the semiconductor layer 20, an interlayer insulating film 9 is formed to cover the gate electrodes 7a and 7b. Further, on the interlayer insulating film 9 in the active region 101, a source electrode 10a of the MOSFET is formed, and on the interlayer insulating film 9 in the current sense region 102, a current sense electrode 10b that functions as a source electrode of the current sense element is formed. The source electrode 10a is connected to the base region 3a and the source region 4a of the MOSFET through a contact hole formed in the interlayer insulating film 9, and the current sense electrode 10b is connected to the base region 3b and the source region 4b of the current sense element through a contact hole formed in the interlayer insulating film 9. The source electrode 10a and the current sense electrode 10b are simultaneously formed in the same electrode forming process, but are patterned so that the source electrode 10a is insulated from the current sense electrode 10b.

Further, a drain electrode 11 is formed on the back surface of the semiconductor substrate 1. The drain electrode 11 is continuously formed over the active region 101 and the current sense region 102, and is shared by the MOSFET and the current sense element.

As can be seen from the above, in the semiconductor device according to the first preferred embodiment, the configuration of the MOSFET cell formed in the active region 101 and the configuration of the current sense cell formed in the current sense region 102 are basically the same. Further, although not illustrated, in this preferred embodiment, the MOSFET cell and the current sense cell have also the same configuration in plan view. In this case, the current division ratio of the current flowing through the current sense region 102 to the current flowing through the active region 101 is largely determined by the ratio of the number of MOSFET cells provided in the active region 101 to the number of current sense cells provided in the current sense region 102. Note that, in order to obtain a desired current division ratio, some of the current sense cells arranged in the current sense region 102 may be dummy cells in which the source region 4b or the gate electrode 7b is omitted.

Note that the configuration of the active region 101 and the current sense region 102 in plan view may be any structure such as a lattice type in which MOSFET cells and current sense cells having a square, a hexagon, or a circle shape in a plan view are vertically and horizontally arranged, or a stripe type in which MOSFET cells and current sense cells are arranged in a stripe pattern.

In the semiconductor device according to the first preferred embodiment, the protective layer 8a is provided below the trench 5a in which the gate electrode 7a of the MOSFET is embedded, and the protective layer 8b is provided below the trench 5b in which the gate electrode 7b of the current sense element is embedded such that the concentration of the electric field at the bottoms of the trenches 5a and 5b is suppressed. In addition, the trench 5c and the protective layer 8c are provided at the boundary portion between the active region 101 and the current sense region 102, and thus the electric field distribution at the boundary portion between the active region 101 and the current sense region 102 is suppressed from becoming singular. Similarly, the trench 5d and the protective layer 8d are provided in the outer peripheral region 103, and thus the electric field distribution at the boundary portion between the active region 101 and the outer peripheral region 103 or the electric field distribution at the boundary portion between the current sense region 102 and the outer peripheral region 103 is suppressed from becoming singular. Therefore, with the semiconductor device according to the first preferred embodiment, electric field concentration due to the provision of the current sense region 102 is suppressed, and it is possible to contribute to improvement of the voltage withstand capability.

As described above, the protective layer 8c formed below the trench 5c at the boundary portion between the active region 101 and the current sense region 102 includes the divided portion 15 divided in the first direction from the active region 101 to the current sense region 102, and thus short circuit between the active region 101 and the current sense region 102 through the protective layer 8c is prevented. However, since the electric field tends to concentrate on the divided portion 15 of the protective layer 8c, it is preferable to appropriately set the width of the divided portion 15 in order to further improve the voltage withstand capability. Specifically, the width of the divided portion 15 of the protective layer 8c is preferably equal to or less than the interval between the trenches 5a in which the gate electrodes 7a of the MOSFET are embedded, and equal to or less than the interval between the trenches 5b in which the gate electrodes 7b of the current sense element are embedded. That is, the width of the divided portion 15 is desirably equal to or smaller than the width of a mesa-shaped semiconductor layer formed between the trenches 5a or between the trenches 5b.

In the active region 101, the interval between the trenches 5a is almost equal to the interval between the protective layers 8a, and in the current sense region 102, the interval between the trenches 5b is almost equal to the interval between the protective layers 8b. The interval between the protective layers 8a largely affects the voltage withstand capability of the MOSFET, and the wider the interval, the lower the voltage withstand capability. The interval between the protective layers 8b largely affects the voltage withstand capability of the current sense element, and the wider the interval, the lower the voltage withstand capability.

Therefore, when the width of the divided portion 15 is wider than the interval between the trenches 5a or the interval between the trenches 5b, the voltage withstand capabilities of the MOSFET and the current sense element can be reduced by the influence of the divided portion 15. Conversely, when the width of the divided portion 15 is equal to or smaller than the interval between the trenches 5a and the interval between the trenches 5b, the voltage withstand capability at the divided portion 15 can be higher than that of the active region 101 and the current sense region 102. Therefore, it is possible to further suppress a reduction in voltage withstand capability due to the provision of the current sense region 102.

Here, a method for manufacturing the semiconductor device according to the first preferred embodiment will be described. First, the first conductivity-type semiconductor layer 20 having a lower impurity concentration than the semiconductor substrate 1 is formed on the first conductivity-type semiconductor substrate 1 by epitaxial growth. Then, by selective ion implantation using a mask formed by photolithography, the second conductivity-type base regions 3a and 3b and the first conductivity-type source regions 4a and 4b are formed in the surface part of the semiconductor layer 20. At this time, the first conductivity-type region of the semiconductor layer 20 that remains without the base regions 3a and 3b and the source regions 4a and 4b becomes the drift layer 2. Further, the trenches 5a to 5d are formed in the semiconductor layer 20 by selective etching using a mask.

Figure 2:
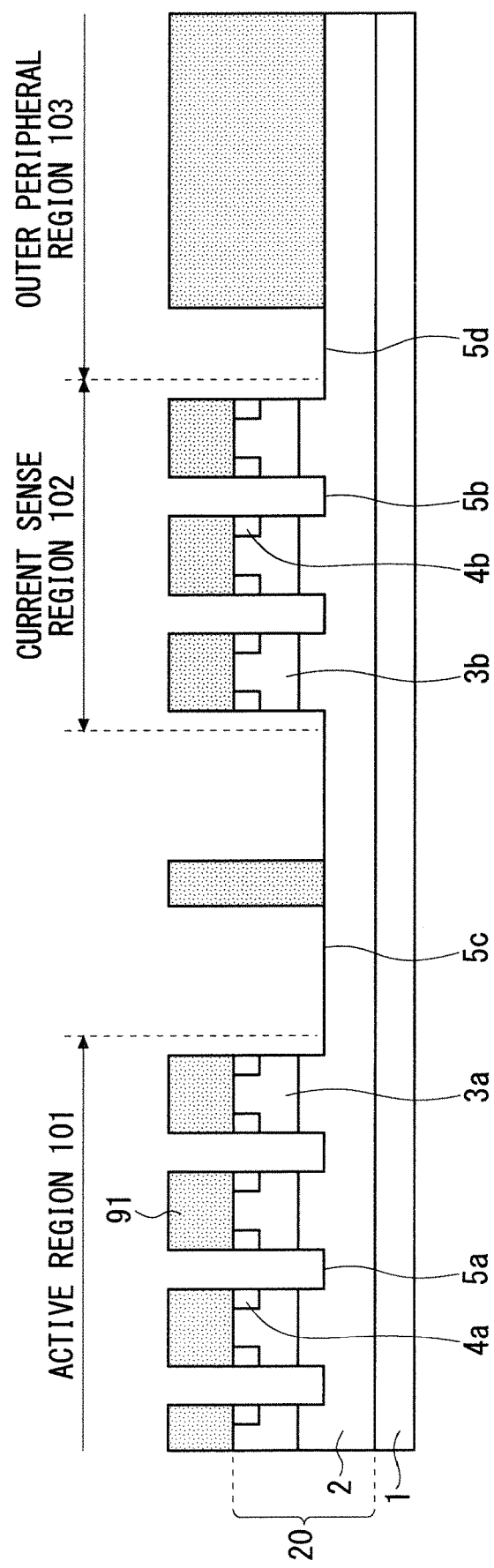
FIGS. 2 and 3 are views for explaining a method of forming a protective layer in manufacture of the semiconductor device according to the first preferred embodiment.
Figure 3:
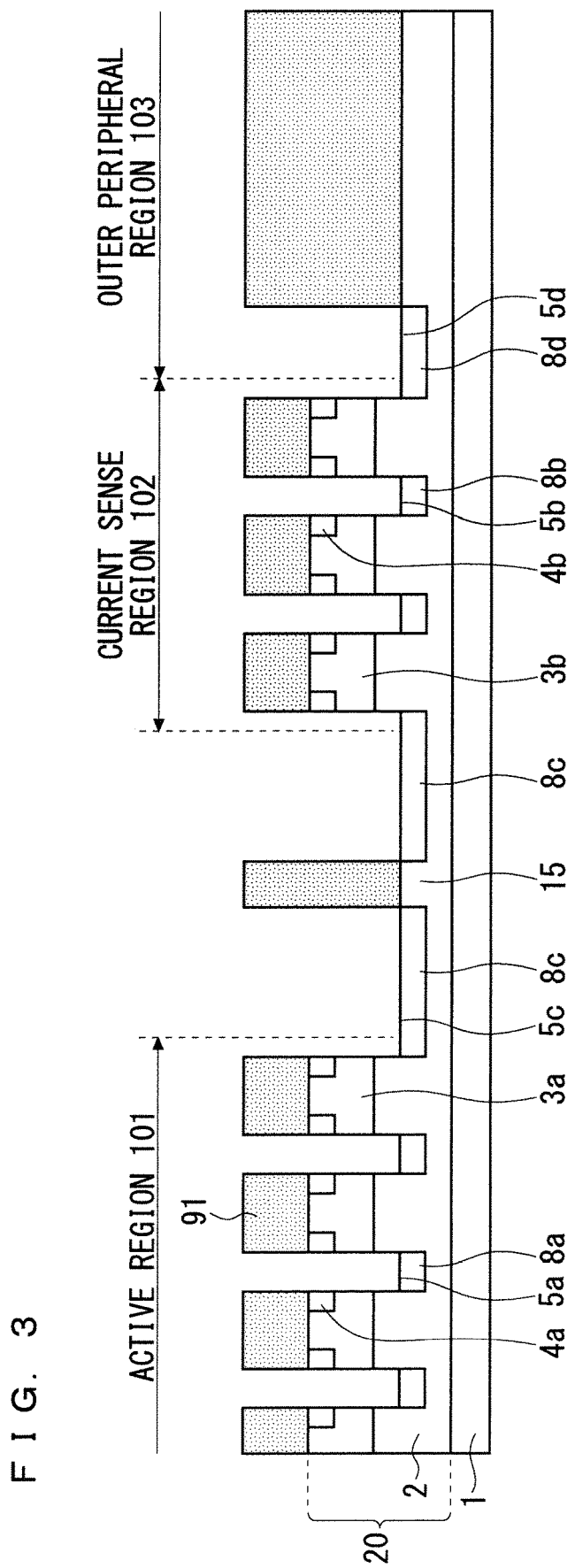

Thereafter, as illustrated in FIG. 2, a resist mask 91 having an opening for the formation region of the protective layers 8a to 8d is formed on the semiconductor layer 20 in which the trenches 5a to 5d are formed, and the protective layers 8a to 8d are formed by selective ion implantation using the resist mask 91 as illustrated in FIG. 3. At this time, a part of the resist mask 91 is formed in the trench 5c so that the protective layer 8c formed below the trench 5c at the boundary portion between the active region 101 and the current sense region 102 has the divided portion 15. Further, another part of the resist mask 91 is formed on the formation region of the guard ring 13 in the trench 5d in the outer peripheral region 103.

After removal of the resist mask 91, the second conductivity-type guard ring 13 is formed below the trench 5d by selective ion implantation using the mask. Subsequently, the gate insulating films 6a and 6b and the gate electrodes 7a and 7b are formed in the trenches 5a and 5b, and the interlayer insulating film 9 is formed to cover them. Then, after contact holes reaching the base regions 3a and 3b and the source regions 4a and 4b are formed in the interlayer insulating film 9, the source electrode 10a and the current sense electrode 10b are formed on the interlayer insulating film 9. Further, by forming the drain electrode 11 on the back surface of the semiconductor substrate 1, the semiconductor device having the configuration illustrated in FIG. 1 is completed.

The method for manufacturing the semiconductor device according to the first preferred embodiment can be obtained with respect to a conventional method for manufacturing a semiconductor device such that the shape of the mask for forming the trenches 5a to 5d is changed so that the trench 5c is formed at the boundary portion between the active region 101 and the current sense region 102 and furthermore the shape of the resist mask 91 defining the pattern of the protective layers 8a to 8d is changed so that the protective layer 8c having the divided portion 15 is formed below the trench 5c. That is, there is no need to increase the number of masks or the number of manufacturing processes with respect to the conventional method for manufacturing a semiconductor device. Therefore, according to the method for manufacturing the semiconductor device according to the present preferred embodiment, a semiconductor device including a trench-type switching element and a trench-type current sense element can be achieved without increasing manufacturing costs and reducing the voltage withstand capability.

Second Preferred Embodiment

Figure 4:
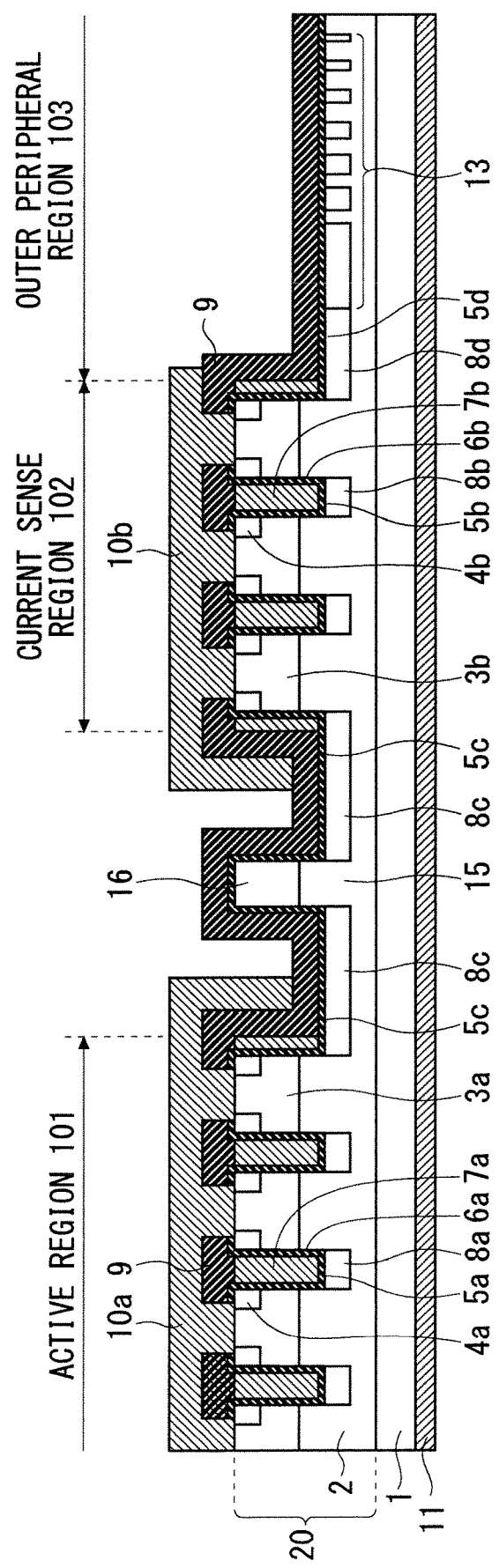
FIG. 4 is a cross-sectional view illustrating a configuration of a semiconductor device according to a second preferred embodiment.

FIG. 4 is a cross-sectional view illustrating a configuration of a semiconductor device according to the second preferred embodiment. In FIG. 4, the same elements as those illustrated in FIG. 1 are denoted by the same reference numerals.

As illustrated in FIG. 4, in the semiconductor device according to the second preferred embodiment, in the trench 5c at the boundary portion between the active region 101 and the current sense region 102, a semiconductor layer 16 having a mesa shape including a part of the semiconductor layer 20 is erected on the divided portion 15 of the protective layer 8c. A second conductivity-type region similar to the base regions 3a and 3b may be formed in an upper layer portion of the semiconductor layer 16 having the mesa shape. Hereinafter, the semiconductor layer 16 having the mesa shape is referred to as the "mesa-shaped semiconductor 16". The other configurations are the same as those in FIG. 1, and the description thereof is omitted here.

Here, a method for manufacturing the semiconductor device according to the second preferred embodiment will be described. First, similar to the first preferred embodiment, the first conductivity-type semiconductor layer 20 is formed on the first conductivity-type semiconductor substrate 1, and, by selective ion implantation, the second conductivity-type base regions 3a and 3b and the first conductivity-type source regions 4a and 4b are formed in the surface part of the semiconductor layer 20.

Figure 6:
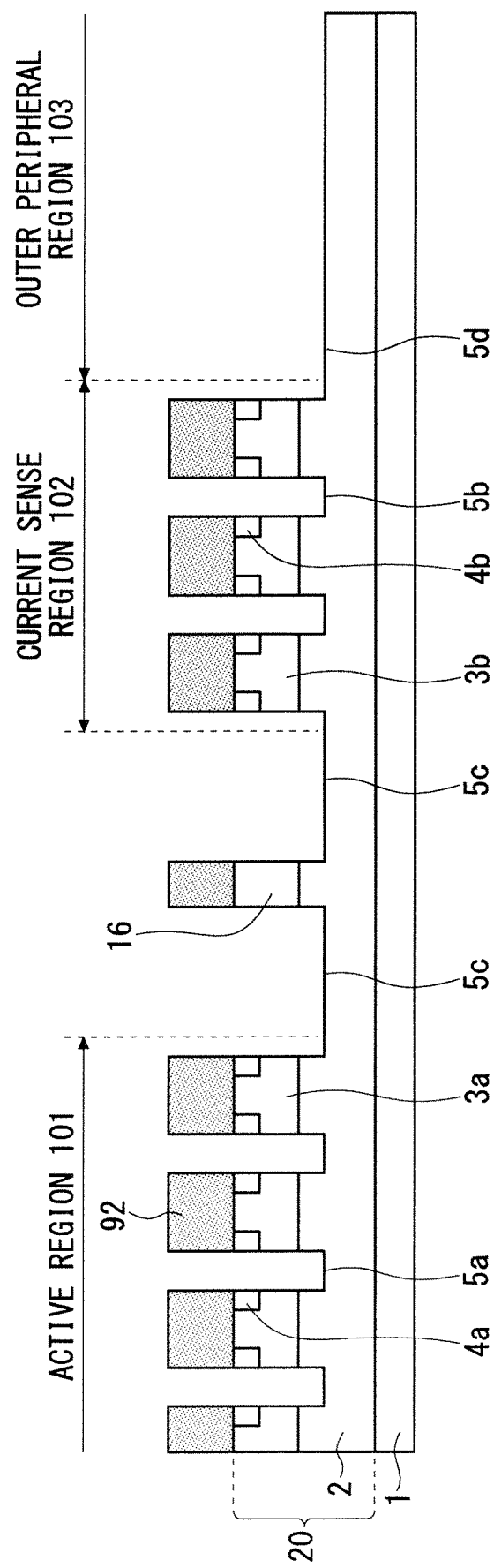

Subsequently, as illustrated in FIG. 5, a resist mask 92 having an opening for the formation regions of the trenches 5a to 5d is formed on the semiconductor layer 20. At this time, the formation region of the mesa-shaped semiconductor 16 is covered by the resist mask 92. Then, the trenches 5a to 5d are formed in the semiconductor layer 20 by selective etching using the resist mask 92 as a mask as illustrated in FIG. 6. At this time, the mesa-shaped semiconductor 16 is formed in the trench 5c at the boundary portion between the active region 101 and the current sense region 102.

Figure 8:
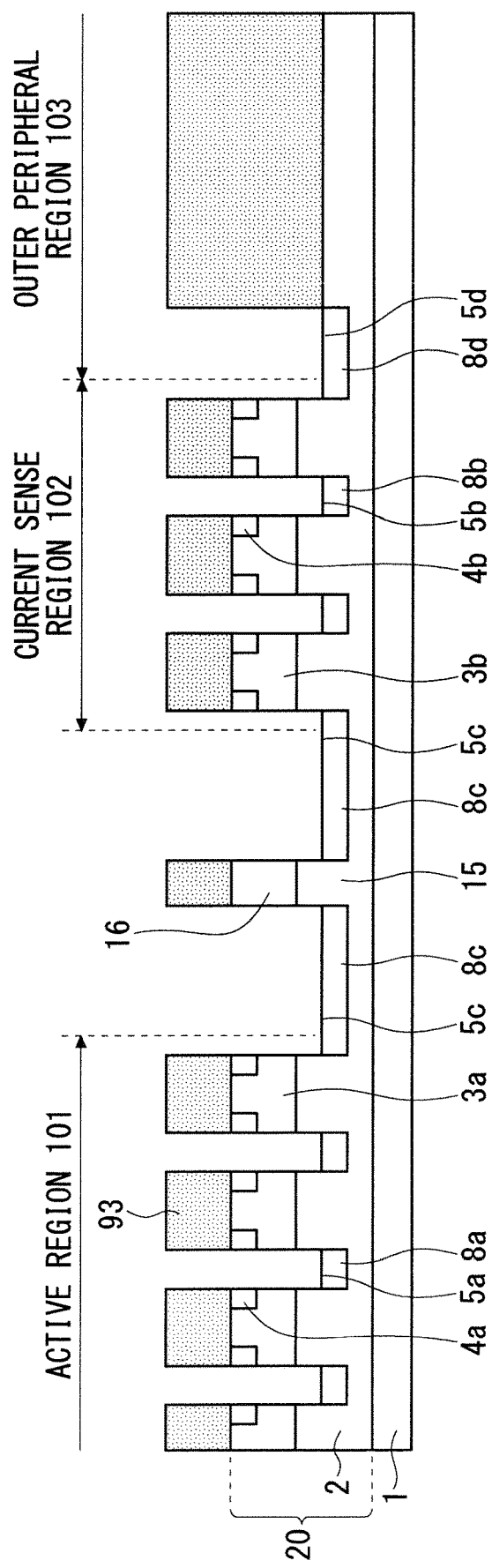

After removal of the resist mask 92, as illustrated in FIG. 7, a resist mask 93 having an opening for the formation region of the protective layers 8a to 8d is formed on the semiconductor layer 20 in which the trenches 5a to 5d are formed. A part of the resist mask 93 is formed on the formation region of the guard ring 13 in the trench 5d of the outer peripheral region 103. Then, the protective layers 8a to 8d are formed by selective ion implantation using the resist mask 93 as illustrated in FIG. 8. At this time, the divided portion 15 of the protective layer 8c is formed below the mesa-shaped semiconductor 16. Therefore, the width of the mesa-shaped semiconductor 16 is preferably equal to or less than the interval between the trenches 5a in which the gate electrodes 7a of the MOSFET are embedded, and equal to or less than the interval between the trenches 5b in which the gate electrodes 7b of the current sense element are embedded.

Then, similar to the first preferred embodiment, the second conductivity-type guard ring 13 is formed below the trench 5d. Subsequently, the gate insulating films 6a and 6b and the gate electrodes 7a and 7b are formed in the trenches 5a and 5b, and the interlayer insulating film 9 is formed thereon. Then, after contact holes reaching the base regions 3a and 3b and the source regions 4a and 4b are formed in the interlayer insulating film 9, the source electrode 10a and the current sense electrode 10b are formed on the interlayer insulating film 9. Further, by forming the drain electrode 11 on the back surface of the semiconductor substrate 1, the semiconductor device having the configuration illustrated in FIG. 4 is completed.

The method for manufacturing the semiconductor device according to the second preferred embodiment can be obtained with respect to the conventional method for manufacturing a semiconductor device such that the shape of the resist mask 92, which is a mask for forming the trenches 5a to 5d, is changed so that the trench 5c including the mesa-shaped semiconductor 16 is formed at the boundary portion between the active region 101 and the current sense region 102 and furthermore the shape of the resist mask 93 defining the pattern of the protective layers 8a to 8d is changed so that the protective layer 8c is formed below the trench 5c. That is, there is no need to increase the number of masks or the number of manufacturing processes with respect to the conventional method for manufacturing a semiconductor device. Therefore, according to the method for manufacturing the semiconductor device according to the present preferred embodiment, a semiconductor device including a trench-type switching element and a trench-type current sense element can be achieved without increasing manufacturing costs and reducing the voltage withstand capability.

Further, as can be seen by comparing FIGS. 8 and 4, in the second preferred embodiment, because the mesa-shaped semiconductor 16 is erected on the formation region of the divided portion 15, the thickness of the resist mask 93 to be formed on the formation region of the divided portion 15 is smaller than the thickness of the resist mask 91 to be formed on the formation region of the divided portion 15 in the first preferred embodiment. Conversely, since the resist mask 91 used in the first preferred embodiment, which is formed at the bottom of the trench 5c, is thicker than the resist mask 93 used in the second preferred embodiment.

Generally, as the thickness of a photoresist increases, the processing controllability decreases. Therefore, when the shape of the divided portion 15 of the protective layer 8c is defined by using the thick resist mask 91 as in the first preferred embodiment, the width of the divided portion 15 varies, and there is a possibility that the voltage withstand capability of the semiconductor device varies and a poor separation between the active region 101 and the current sense region 102 can occur. Further, the width of the divided portion 15 is preferably equal to or less than the interval between the trenches 5a in which the gate electrodes 7a of the MOSFET are embedded, and equal to or less than the interval between the trenches 5b in which the gate electrodes 7b of the current sense elements are embedded. Therefore, depending on the combination of the depth of the trench 5c and the width of the divided portion 15, the aspect ratio of the resist mask 91 provided on the formation region of the divided portion 15 becomes large, and, in the worst case, the resist mask 91 can fall down.

On the other hand, in the second preferred embodiment, the shape of the divided portion 15 is defined by the mesa-shaped semiconductor 16. That is, the mesa-shaped semiconductor 16 plays a role as a mask for ion implantation for forming the divided portion 15. Since the controllability of the width of the mesa-shaped semiconductor 16 is higher than the controllability of the width of the photoresist, the controllability of the width of the divided portion 15 can be improved as compared with the first preferred embodiment. This can prevent variations in the voltage withstand capability of the semiconductor device and a poor separation between the active region 101 and the current sense region 102.

Figure 9:
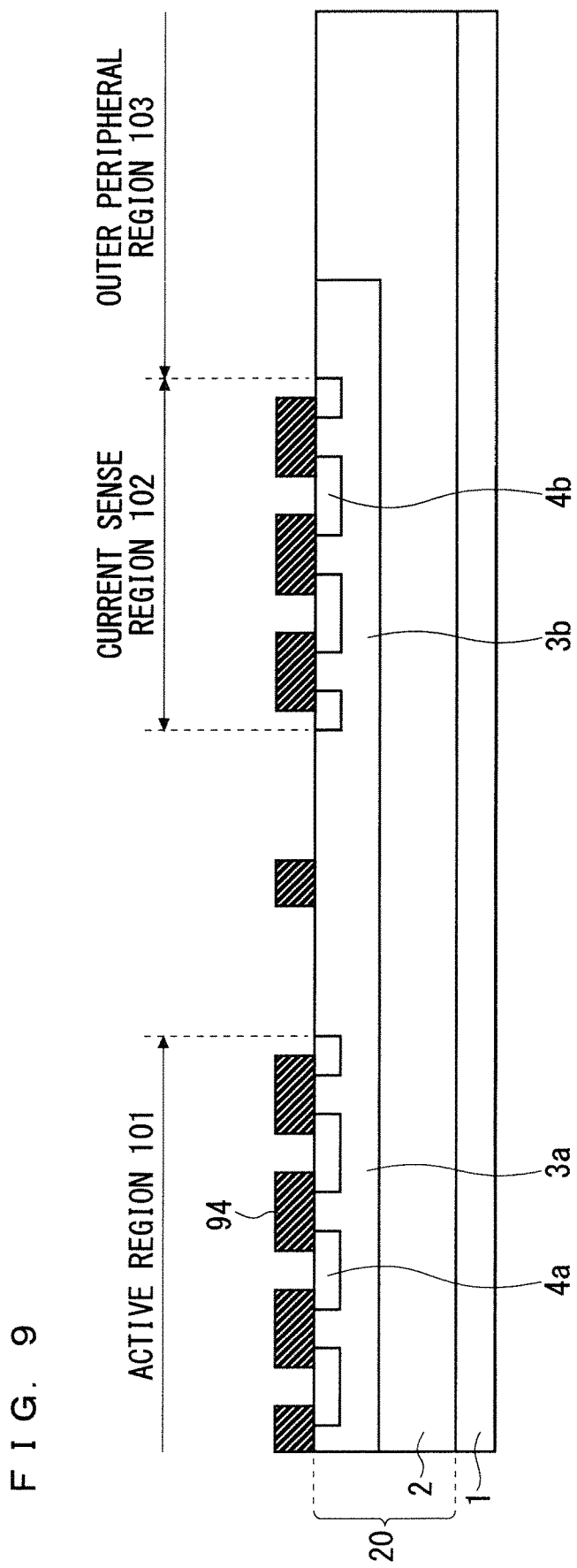
Figure 10:
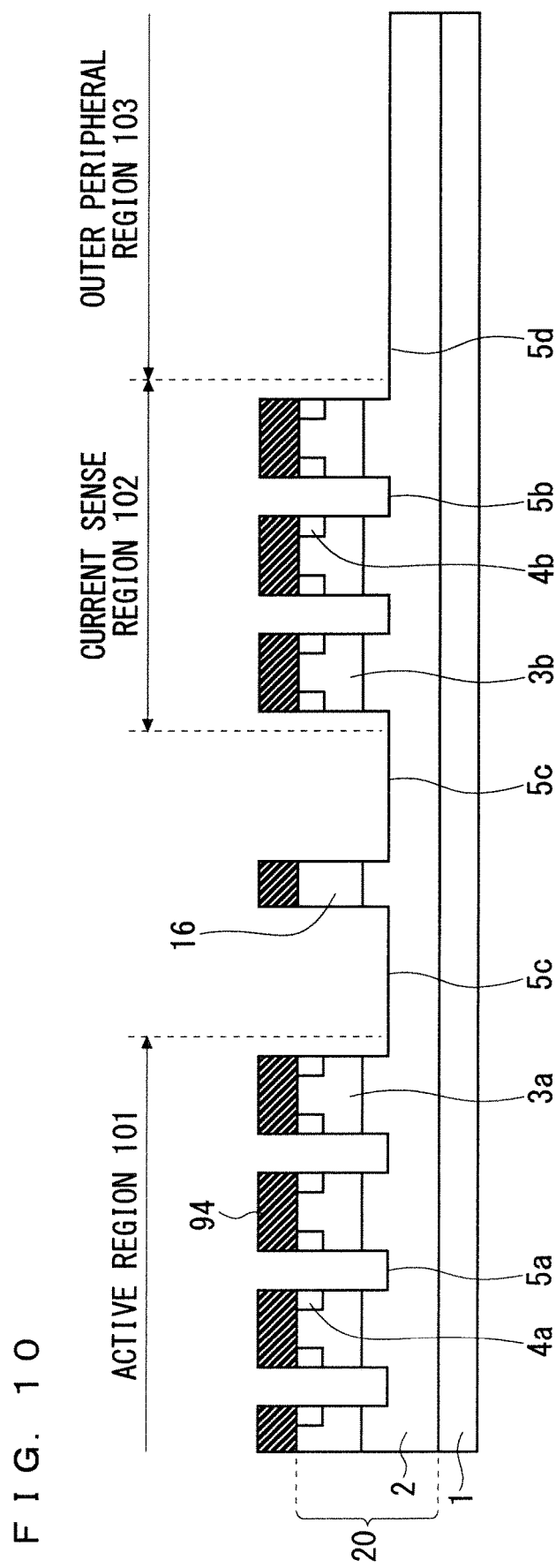

In the above description, the resist mask 92 is used as an etching mask for forming the trenches 5a to 5d, but an oxide film mask 94 may be used instead as illustrated in FIG. 9. In this case, as illustrated in FIG. 10, the trenches 5a to 5d are formed by selective etching using the oxide film mask 94 as a mask. At this time, the mesa-shaped semiconductor 16 is formed in the trench 5c at the boundary portion between the active region 101 and the current sense region 102.

Figure 11:
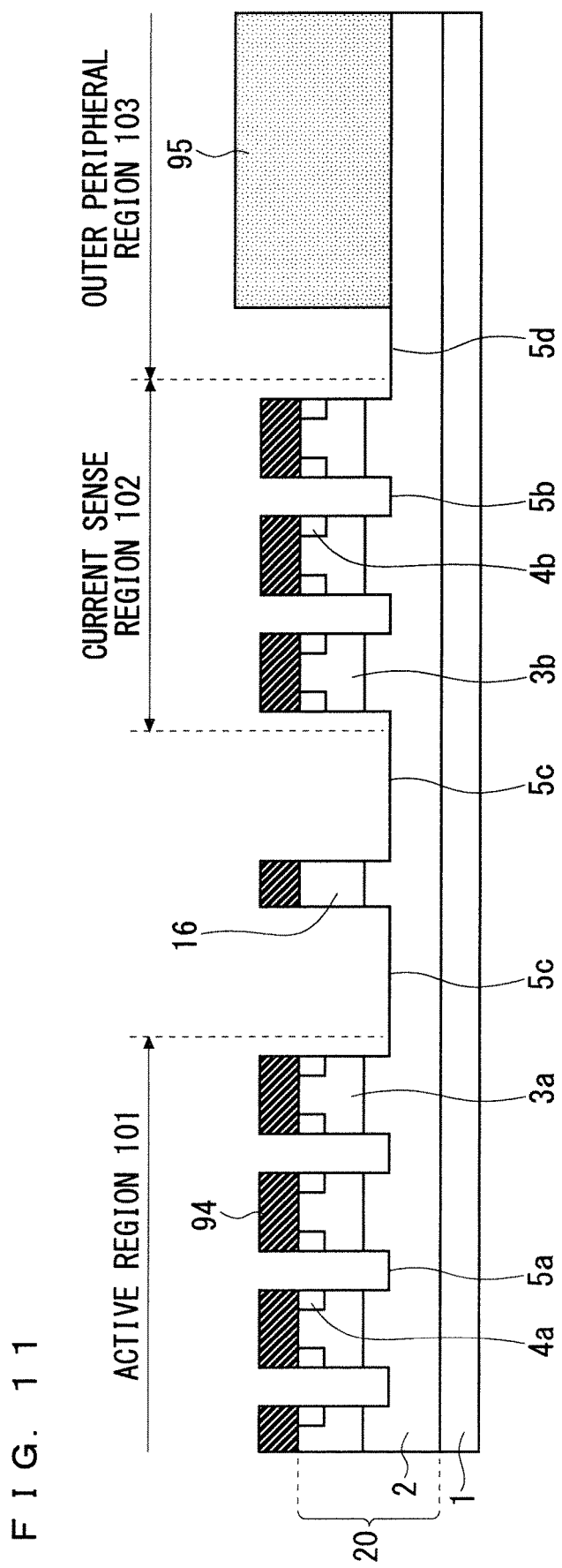
Figure 12:
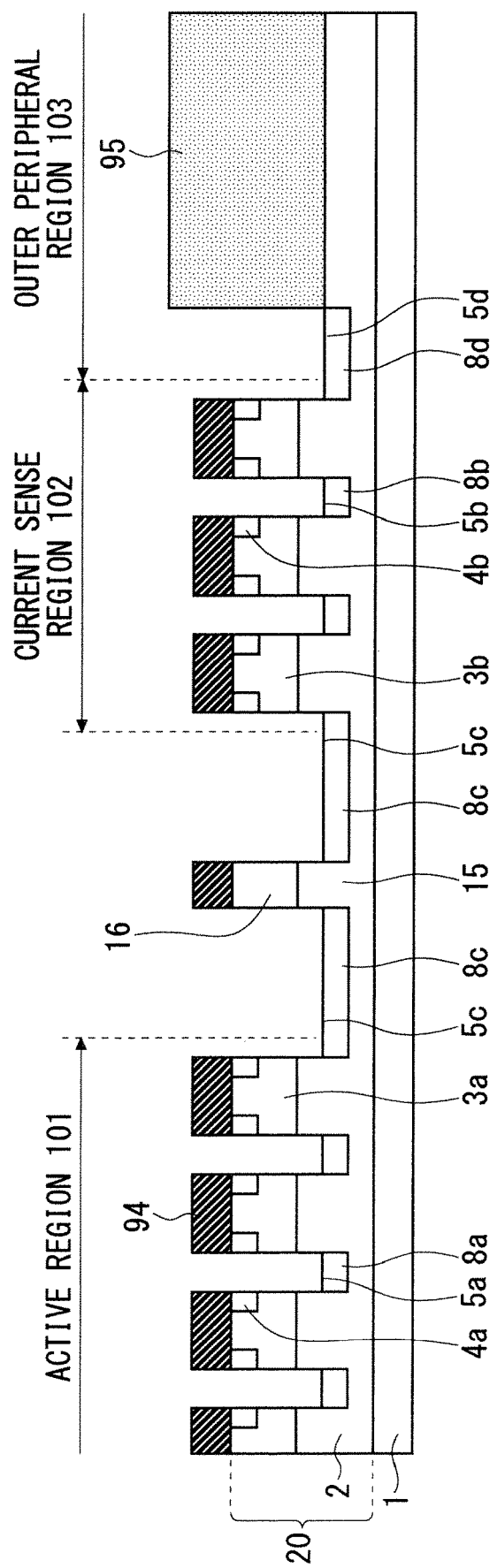

Then, as illustrated in FIG. 11, while leaving the oxide film mask 94, a resist mask 95 covering the formation region of the guard ring 13 is formed in the trench 5d in the outer peripheral region 103, and selective ion implantation using the oxide film mask 94 and the resist mask 95 as masks is performed to form the protective layers 8a to 8d as illustrated in FIG. 12. At this time, the divided portion 15 of the protective layer 8c is formed below the mesa-shaped semiconductor 16.

According to this method, since the oxide film mask 94 used as an etching mask for forming the trenches 5a to 5d is also used as a mask for ion implantation for forming the trenches 5a to 5d, the protective layers 8a to 8d are formed in a self-aligned manner at the bottoms of the trenches 5a to 5*d*, respectively. Therefore, the alignment accuracy between the trenches 5*a* to 5*d* and the protective layers 8*a* to 8*d* can be improved.

The method for manufacturing the semiconductor device described in conjunction with FIGS. 9 to 12 can be obtained with respect to the conventional method for manufacturing a semiconductor device such that the shape of the oxide film mask 94 defining the pattern of the trenches 5*a* to 5*d* and of the resist mask 95 defining the pattern of the protective layers 8*a* to 8*d* is changed. That is, there is no need to increase the number of masks or the number of manufacturing processes with respect to the conventional method for manufacturing a semiconductor device.

Third Preferred Embodiment

Figure 13:
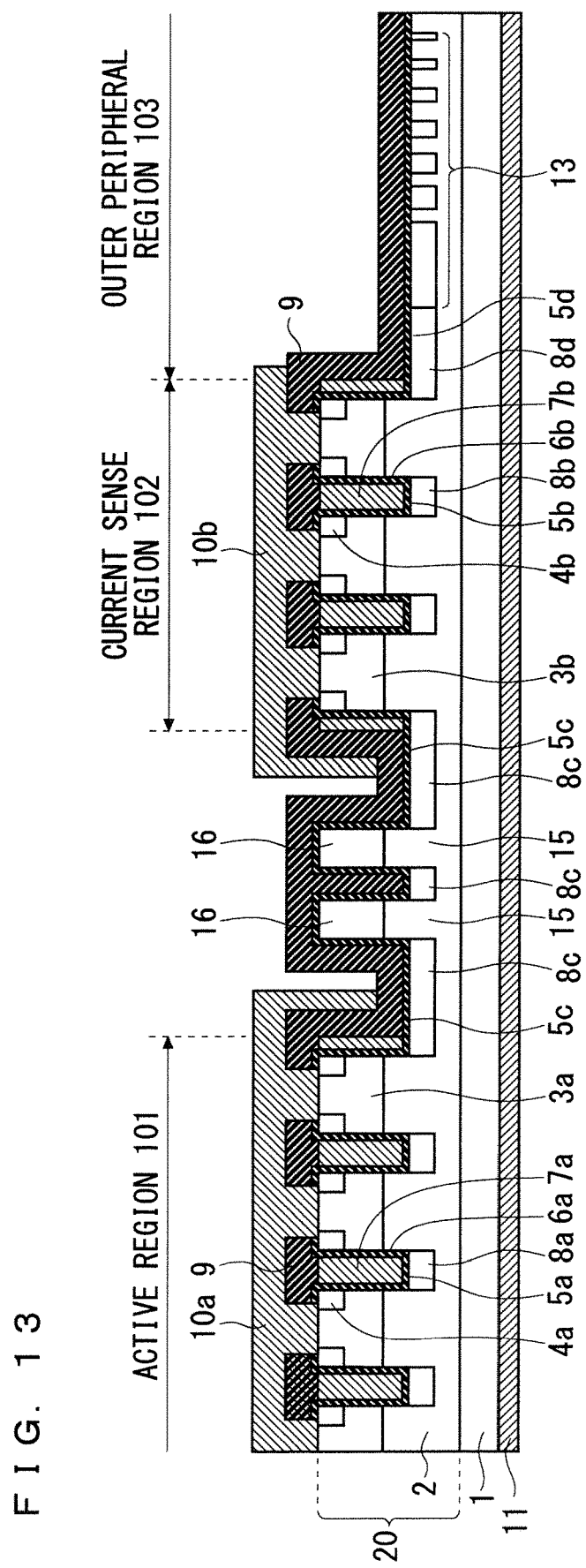
FIG. 13 is a cross-sectional view illustrating a configuration of a semiconductor device according to a third preferred embodiment.

FIG. 13 is a cross-sectional view illustrating a configuration of a semiconductor device according to the third preferred embodiment. In FIG. 13, the same elements as those illustrated in FIGS. 1 and 4 are denoted by the same reference numerals.

As illustrated in FIG. 13, in the semiconductor device according to the third preferred embodiment, in the trenches 5*c* at the boundary portion between the active region 101 and the current sense region 102, a plurality of divided portions 15 of protective layers 8*c* and a plurality of mesa-shaped semiconductors 16 thereon are provided along the first direction from the active region 101 to the current sense region 102. The other configurations are the same as those in FIG. 4, and the description thereof is omitted here.

As described in the second preferred embodiment, the mesa-shaped semiconductor 16 is superior to a photoresist in processing controllability. However, when the length of the boundary between the active region 101 and the current sense region 102 (the length in a second direction perpendicular to the first direction) is long, the mesa-shaped semiconductor 16 also becomes long. Therefore, there is a concern that the mesa-shaped semiconductor 16 is formed to have a partially narrow width at the time of etching of forming the trenches 5*a* to 5*d* or that the mesa-shaped semiconductor 16 is disconnected due to the influence of a foreign matter or the like. In this case, the width of the divided portion 15 becomes partially narrowed or the divided portion 15 is disconnected in the second direction, thereby causing variations in voltage withstand capability of the semiconductor device or a poor separation between the active region 101 and the current sense region 102.

In the semiconductor device according to the third preferred embodiment, the plurality of divided portions 15 of the protective layers 8*c* and the plurality of mesa-shaped semiconductors 16 thereon are provided along the first direction from the active region 101 to the current sense region 102. Therefore, for example, even if a variation in the width or a disconnection in the second direction occurs in some of the plurality of divided portions 15, a variation in the voltage withstand capability of the semiconductor device and a poor separation between the active region 101 and the current sense region 102 can be prevented.

Note that, in the trench between the mesa-shaped semiconductors 16, the interlayer insulating film 9 may be embedded as illustrated in FIG. 13 or the same insulating films and electrodes as the gate insulating films 6*a* and 6*b* and gate electrodes 7*a* and 7*b* may be embedded. When an insulating film and an electrode are embedded in the trench between the mesa-shaped semiconductors 16, it is desirable that such electrode be insulated from the gate electrodes 7*a* and 7*b* and have a floating potential. Further, in this case, it is desirable that the mesa-shaped semiconductor 16 be provided with the same second conductivity-type region as the base regions 3*a* and 3*b* and be not provided with the first conductivity-type region such as the source regions 4*a* and 4*b*. This is to prevent a MOSFET from being formed in the mesa-shaped semiconductor 16 and causing an unintended operation.

The method for manufacturing the semiconductor device according to the third preferred embodiment can be obtained with respect to the method for manufacturing the semiconductor device of the second preferred embodiment such that the shape of the resist mask 92 (or oxide film mask 94) defining the pattern of the trenches 5*a* to 5*d* and of the resist mask 93 (or resist mask 95) defining the pattern of the protective layers 8*a* to 8*d* is changed. That is, there is no need to increase the number of masks or the number of manufacturing processes with respect to the conventional method for manufacturing a semiconductor device.

Note that, in the third preferred embodiment, the configuration in which the plurality of divided portions 15 of the protective layers 8*c* and the plurality of mesa-shaped semiconductors 16 are provided along the first direction is indicated, but in a configuration in which the mesa-shaped semiconductor 16 is not provided on the divided portion 15 as in, for example, the first preferred embodiment, a plurality of divided portions 15 may be provided in the first direction. Also in this case, when a variation in the width of the divided portion 15 or a disconnection in the second direction occurs, the effect of preventing a variation in the voltage withstand capability of the semiconductor device and a poor separation between the active region 101 and the current sense region 102 can be obtained.

Fourth Preferred Embodiment

Figure 14:
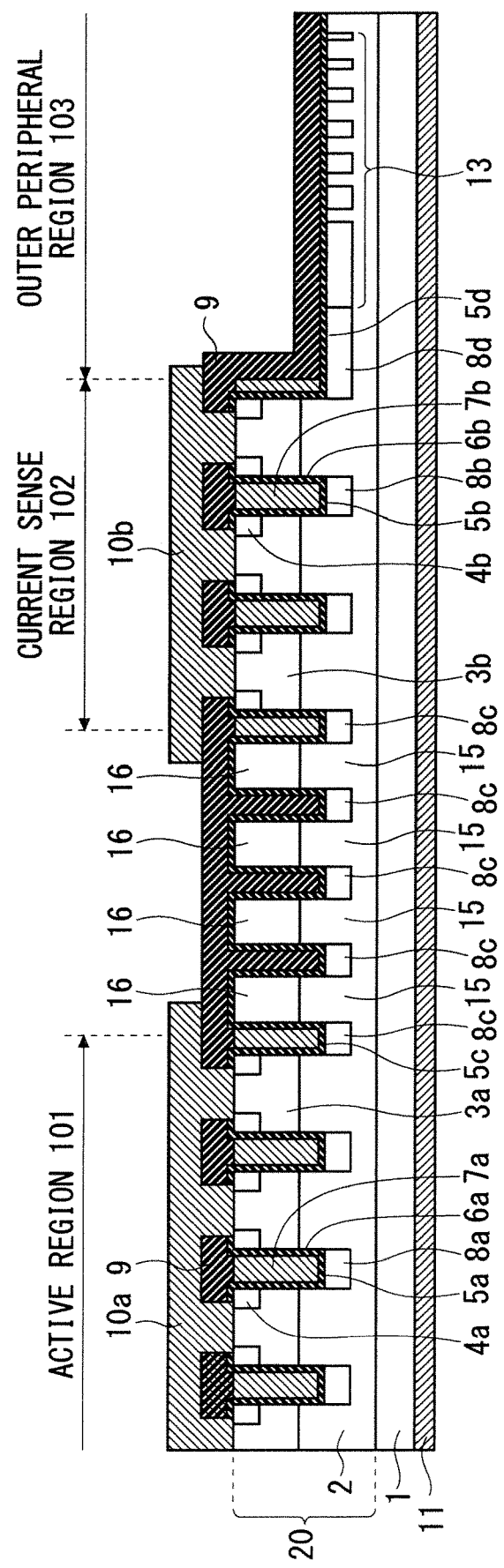
FIG. 14 is a cross-sectional view illustrating a configuration of a semiconductor device according to a fourth preferred embodiment.

FIG. 14 is a cross-sectional view illustrating a configuration of a semiconductor device according to the fourth preferred embodiment. In FIG. 14, the same elements as those illustrated in FIGS. 1 and 4 are denoted by the same reference numerals.

As illustrated in FIG. 14, in the semiconductor device according to the fourth preferred embodiment, in the trenches 5*c* at the boundary portion between the active region 101 and the current sense region 102, a plurality of divided portions 15 of protective layers 8*c* and a plurality of mesa-shaped semiconductors 16 thereon are provided along the first direction from the active region 101 to the current sense region 102, and they are arranged at equal intervals between the active region 101 and the current sense region 102. The other configurations are the same as those in FIG. 4, and the description thereof is omitted here.

Since the mesa-shaped semiconductor 16 has a height equal to the depth of the trench 5*c*, when the number of the mesa-shaped semiconductors 16 is one as in the second preferred embodiment (FIG. 4), or when the interval between the plurality of mesa-shaped semiconductors 16 is large as in the third preferred embodiment (FIG. 13), a level difference of the same degree as the height of the mesa-shaped semiconductor 16 is formed on the surface of the interlayer insulating film 9 formed on the trench 5*c* at the boundary portion between the active region 101 and the current sense region 102.

On the other hand, in the semiconductor device of the fourth preferred embodiment, as illustrated in FIG. 14, a plurality of mesa-shaped semiconductors 16 are uniformly provided from the end of the trench 5*c* on the active region 101 side to the end on the current sense region 102 side, and the interval between the mesa-shaped semiconductors 16 is narrowed. Here, the interval between the mesa-shaped semiconductors 16 is equal to the width of the trench 5a in the active region 101 and the width of the trench 5b in the current sense region 102. As a result, the surface of the interlayer insulating film 9 formed on the trench 5c becomes flat.

For example, when an external electrode is mounted on a semiconductor device and they are sealed in a housing to form a module, there is no problem as long as the housing is filled with a soft insulating material such as a gel. However, when a hard insulating material such as a resin is poured, stress concentrates on a portion of the surface of the semiconductor device where the flatness is poor, so that a level difference on the surface of the semiconductor device causes cracking. Since the semiconductor device of the present preferred embodiment has high surface flatness, concentration of stress can be suppressed and a defect rate when the semiconductor device is modularized can be reduced.

The method for manufacturing the semiconductor device according to the fourth preferred embodiment can be obtained with respect to the method for manufacturing the semiconductor device of the second preferred embodiment such that the shape of the resist mask 92 (or oxide film mask 94) defining the pattern of the trenches 5a to 5d and of the resist mask 93 (or resist mask 95) defining the pattern of the protective layers 8a to 8d is changed. That is, there is no need to increase the number of masks or the number of manufacturing processes with respect to the conventional method for manufacturing a semiconductor device.

Fifth Preferred Embodiment

Figure 15:
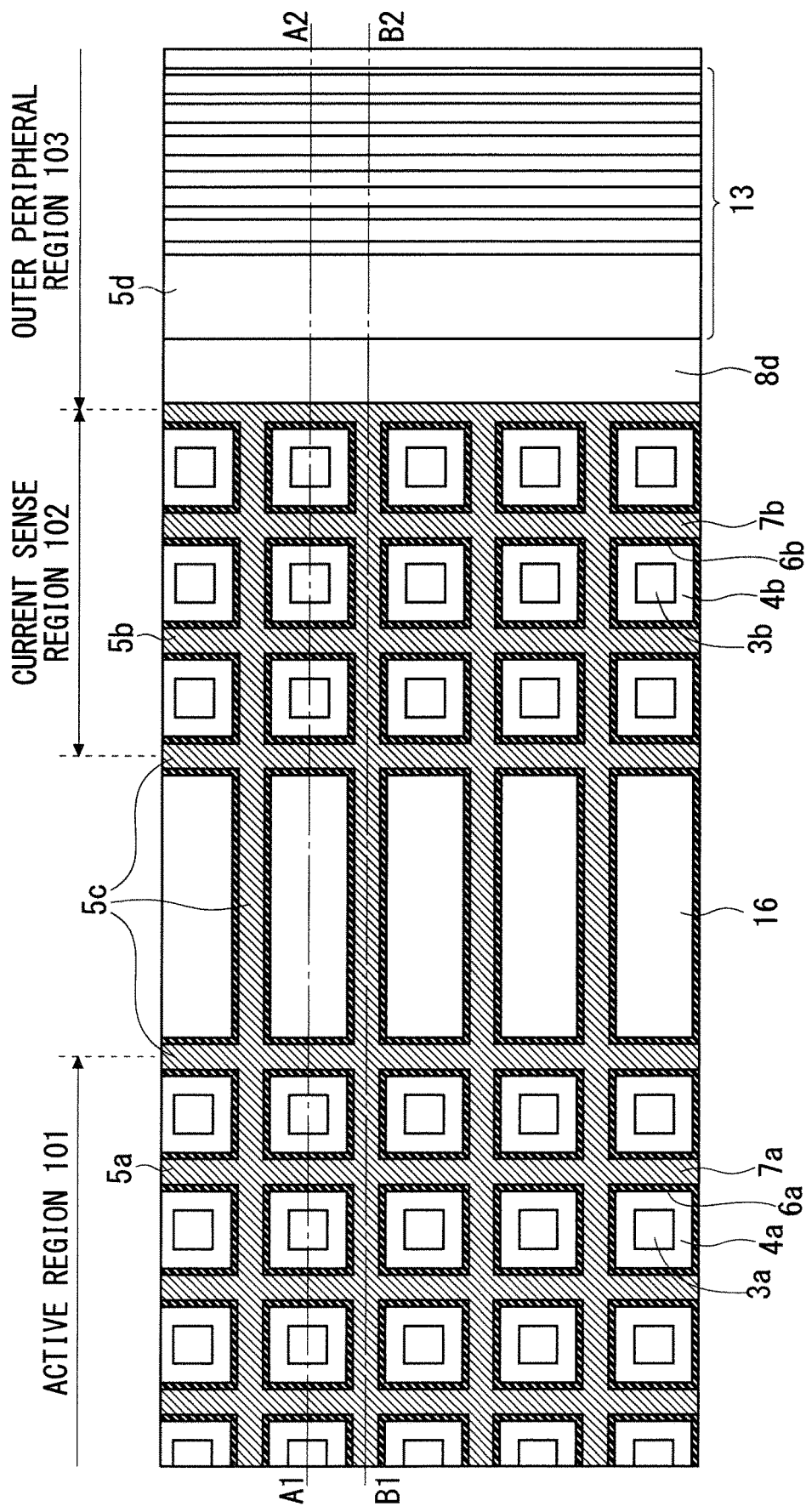
FIG. 15 is a plan view illustrating a configuration of a semiconductor device according to a fifth preferred embodiment.
Figure 16:
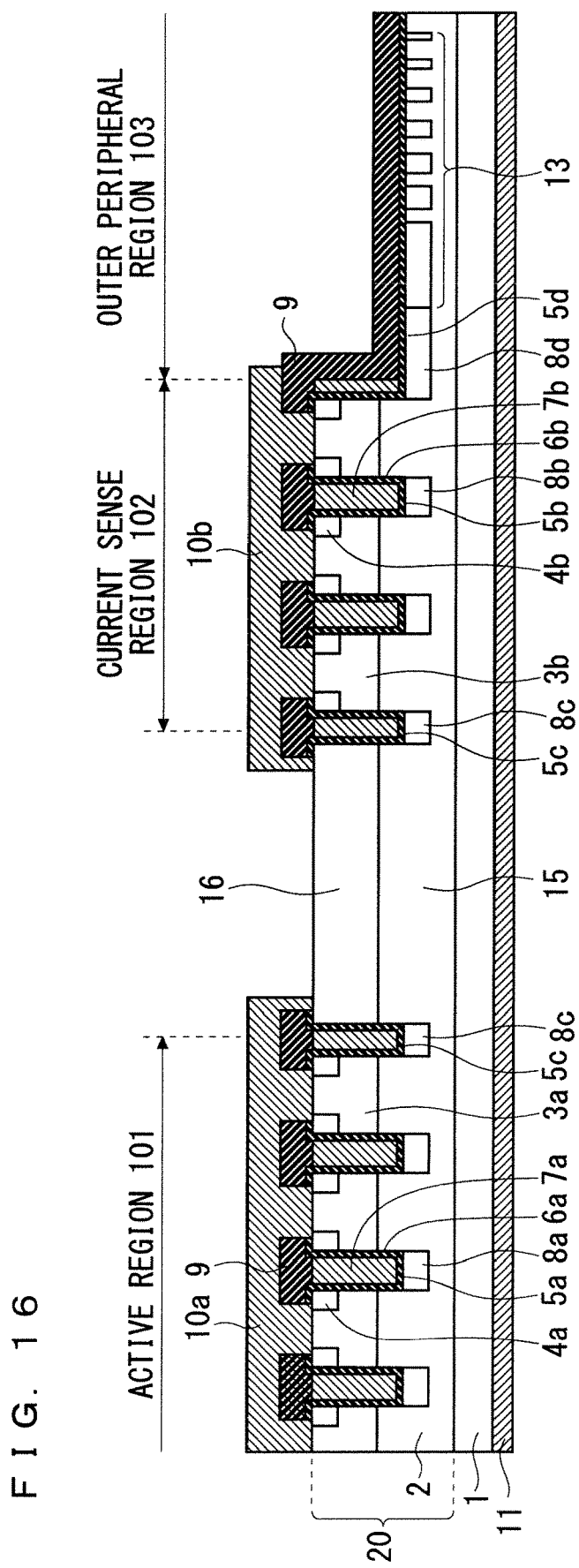
FIGS. 16 and 17 are cross-sectional views illustrating a configuration of a semiconductor device according to the fifth preferred embodiment.
Figure 17:
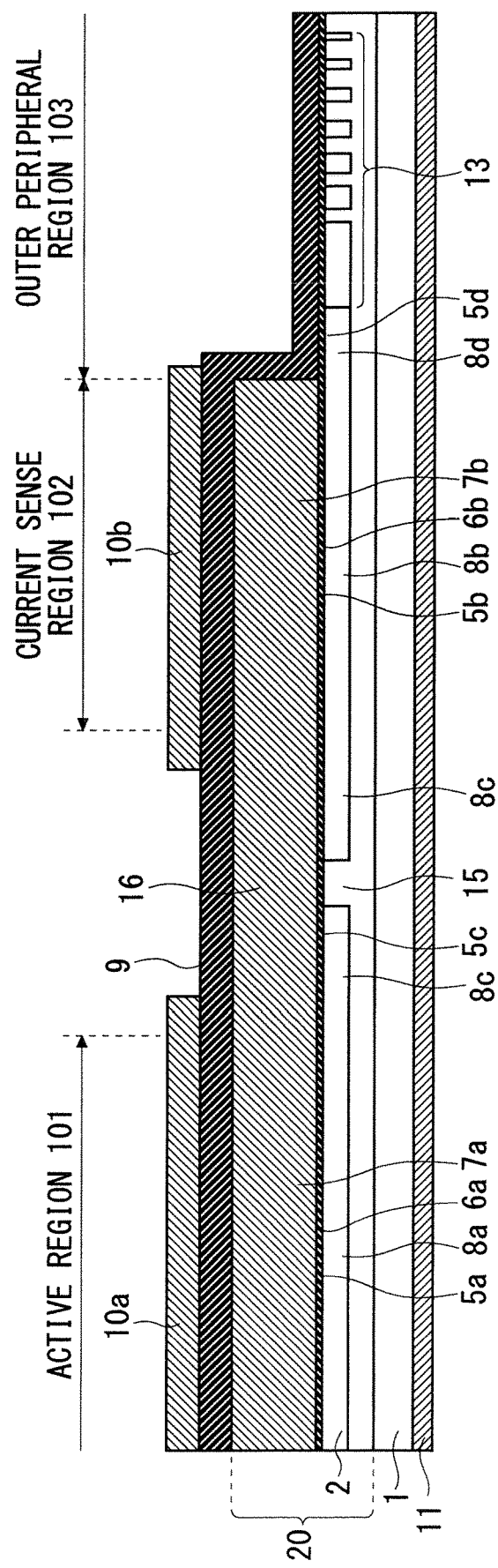

FIGS. 15 to 17 are views illustrating a configuration of the semiconductor device according to the fifth preferred embodiment. FIG. 15 is a plan view of the semiconductor device, FIG. 16 is a cross-sectional view taken along line A1-A2 in FIG. 15, and FIG. 17 is a cross-sectional view taken along line B1-B2 in FIG. 15. In these drawings, the same elements as those illustrated in FIGS. 1 and 4 are denoted by the same reference numerals. Note that FIG. 15 illustrates the configuration of the upper surface of the semiconductor layer 20, and the illustration of the interlayer insulating film 9, the source electrode 10a, the current sense electrode 10b, and the like formed on the semiconductor layer 20 is omitted.

In the semiconductor device according to the fifth preferred embodiment, as illustrated in FIGS. 15 to 17, in the trenches 5c at the boundary portion between the active region 101 and the current sense region 102, a plurality of mesa-shaped semiconductors 16 are formed side by side in the second direction perpendicular to the first direction from the active region 101 to the current sense region 102. Further, each of the mesa-shaped semiconductors 16 is continuously formed from a portion near the end of the trench 5c on the active region 101 side to a portion near the end on the current sense region 102 side. That is, the length of the mesa-shaped semiconductor 16 in the first direction is shorter than the width of the trench 5c, but is close to the width of the trench 5c.

The length of the mesa-shaped semiconductor 16 in the first direction is longer than the length in the second direction, and the mesa-shaped semiconductor 16 is provided in the second direction at the same interval as the interval of the cells of the MOSFET. That is, the length of the mesa-shaped semiconductor 16 in the second direction is equal to the interval of the trenches 5a of the active region 101, and the interval of the mesa-shaped semiconductors 16 in the second direction is equal to the width of the trench 5a of the active region 101.

Further, as illustrated in FIGS. 15 and 17, the divided portion 15 of the protective layer 8c provided below the trench 5c at the boundary portion between the active region 101 and the current sense region 102 is formed not only below the mesa-shaped semiconductor 16, but also in a region between the mesa-shaped semiconductors 16 to divide the protective layer 8c in the first direction. The other configurations are the same as those in FIG. 4, and the description thereof is omitted here.

With the semiconductor device according to the fifth preferred embodiment, the mesa-shaped semiconductor 16 is continuously formed from a portion near the end of the trench 5c on the active region 101 side to a portion near the end on the current sense region 102 side, and the interval of the mesa-shaped semiconductor 16 in the second direction is as narrow as the width of the trench 5a of the active region 101, and thus the surface of the interlayer insulating film 9 formed on the trench 5c can be flattened and the same effect as in the fourth preferred embodiment can be obtained.

The method for manufacturing the semiconductor device according to the fourth preferred embodiment can be obtained with respect to the method for manufacturing the semiconductor device according to the second preferred embodiment such that the shape of the resist mask 92 defining the pattern of the trenches 5a to 5d and of the resist mask 93 defining the pattern of the protective layers 8a to 8d is changed. That is, there is no need to increase the number of masks or the number of manufacturing processes with respect to the conventional method for manufacturing a semiconductor device.

In the present invention, each preferred embodiment can be freely combined, or each preferred embodiment can be appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor layer in which a first conductivity-type drift layer is formed;
   a trench-type switching element in which a gate electrode is embedded in a first trench formed in the semiconductor layer to reach the drift layer;
   a trench-type current sense element in which a gate electrode is embedded in a second trench formed in the semiconductor layer to reach the drift layer;
   a third trench configured to be formed in the semiconductor layer at a boundary portion between an active region where the switching element is formed and a current sense region where the current sense element is formed, and reach the drift layer;
   a second conductivity-type first protective layer formed directly below the first trench in the drift layer;
   a second conductivity-type second protective layer formed directly below the second trench in the drift layer; and
   a second conductivity-type third protective layer formed directly below the third trench in the drift layer such that a portion of the third protective layer overlaps the third trench, wherein the third protective layer has a divided portion divided in a first direction from the active region to the current sense region, and first end surfaces of the third protective layer facing each other form the divided portion, and second end surfaces of the third protective layer opposite to the first end surfaces are positioned between opposing sidewalls of the third trench.

2. The semiconductor device according to claim 1, wherein a plurality of the divided portion of the third protective layer are provided along the first direction.

3. The semiconductor device according to claim 1, further comprising:
a fourth trench configured to be formed in the semiconductor layer in an outer peripheral region provided around the active region and the current sense region, and reach the drift layer; and
a second conductivity-type fourth protective layer formed below the fourth trench in the drift layer.

4. The semiconductor device according to claim 1, wherein the second end surfaces of the third protective layer opposite to the divided portion are vertically aligned with the opposing sidewalls of the third trench.

5. A semiconductor device comprising:
a semiconductor layer in which a first conductivity-type drift layer is formed;
a trench-type switching element in which a gate electrode is embedded in a first trench formed in the semiconductor layer to reach the drift layer;
a trench-type current sense element in which a gate electrode is embedded in a second trench formed in the semiconductor layer to reach the drift layer;
a third trench configured to be formed in the semiconductor layer at a boundary portion between an active region where the switching element is formed and a current sense region where the current sense element is formed, and reach the drift layer;
a second conductivity-type first protective layer formed below the first trench in the drift layer;
a second conductivity-type second protective layer formed below the second trench in the drift layer; and
a second conductivity-type third protective layer formed below the third trench in the drift layer, wherein
the third protective layer has a divided portion divided in a first direction from the active region to the current sense region, and
a width of the divided portion of the third protective layer is equal to or less than an interval of the first trenches and an interval of the second trenches.

6. The semiconductor device according to claim 5, wherein
the gate electrode in the switching element is included among a plurality of gate electrodes in the switching element,
the first trench is included among a plurality of first trenches formed in the semiconductor layer to reach the drift layer in the switching element,
the gate electrodes in the switching element are respectively embedded in the first trenches,
the gate electrode in the current sense element is included among a plurality of gate electrodes in the current sense element,
the second trench is included among a plurality of second trenches formed in the semiconductor layer to reach the drift layer in the current sense element,
the gate electrodes in the current sense element are respectively embedded in the first trenches, the first protective layer and the second protective layer are formed below the second trenches, and
the width of the divided portion of the third protective layer is equal to or less than an interval between adjacent ones of the first trenches and an interval between adjacent ones of the second trenches.

7. The semiconductor device according to claim 6, wherein the width of the divided portion of the third protective layer, the interval between adjacent ones of the first trenches and the interval between adjacent ones of the second trenches are each measured in the first direction.

8. A semiconductor device comprising:
a semiconductor layer in which a first conductivity-type drift layer is formed;
a trench-type switching element in which a gate electrode is embedded in a first trench formed in the semiconductor layer to reach the drift layer;
a trench-type current sense element in which a gate electrode is embedded in a second trench formed in the semiconductor layer to reach the drift layer;
a third trench configured to be formed in the semiconductor layer at a boundary portion between an active region where the switching element is formed and a current sense region where the current sense element is formed, and reach the drift layer;
a second conductivity-type first protective layer formed below the first trench in the drift layer;
a second conductivity-type second protective layer formed below the second trench in the drift layer; and
a second conductivity-type third protective layer formed directly below the third trench in the drift layer such that a portion of the third protective layer overlaps the third trench, wherein
the third protective layer has a divided portion divided in a first direction from the active region to the current sense region, and
in the third trench, the semiconductor layer having a mesa shape and extending upward from a bottom surface of the third trench is formed on the divided portion of the third protective layer.

9. The semiconductor device according to claim 8, wherein a plurality of the divided portions of the third protective layer and a plurality of the semiconductor layers having the mesa shape are provided along the first direction.

10. The semiconductor device according to claim 9, wherein the divided portions of the third protective layer and the semiconductor layers having the mesa shape are provided at equal intervals along the first direction.

11. A semiconductor device comprising:
a semiconductor layer in which a first conductivity-type drift layer is formed;
a trench-type switching element in which a gate electrode is embedded in a first trench formed in the semiconductor layer to reach the drift layer;
a trench-type current sense element in which a gate electrode is embedded in a second trench formed in the semiconductor layer to reach the drift layer;
a third trench configured to be formed in the semiconductor layer at a boundary portion between an active region where the switching element is formed and a current sense region where the current sense element is formed, and reach the drift layer;
a second conductivity-type first protective layer formed below the first trench in the drift layer;
a second conductivity-type second protective layer formed below the second trench in the drift layer; and a second conductivity-type third protective layer formed below the third trench in the drift layer, wherein the third protective layer has a divided portion divided in a first direction from the active region to the current sense region, and in the third trench, a plurality of the semiconductor layers having the mesa shape are formed side by side in a second direction perpendicular to the first direction.

12. The semiconductor device according to claim 11, wherein a length of the semiconductor layer having the mesa shape in the first direction is longer than a length in the second direction.

13. The semiconductor device according to claim 12, wherein the semiconductor layers having the mesa shape are provided in the second direction at the same interval as an interval of cells of the switching element.

14. The semiconductor device according to claim 11, wherein the plurality of semiconductor layers having the mesa shape extend upward from a bottom surface of the third trench.

15. The semiconductor device according to claim 11, wherein the plurality of the semiconductor layers having the mesa shape form a plurality of mesa shaped structures extending upward from a bottom surface of the third trench, the plurality of mesa shaped structures being formed side by side in the second direction.

* * * * *